(12) United States Patent
Paik et al.

(10) Patent No.: US 8,062,547 B2
(45) Date of Patent: Nov. 22, 2011

(54) CMP SLURRY, PREPARATION METHOD THEREOF AND METHOD OF POLISHING SUBSTRATE USING THE SAME

(75) Inventors: Un Gyu Paik, Seoul (KR); Jea Gun Park, Seongnam-Si (KR); Sang Kyun Kim, Busan (KR); Ye Hwan Kim, Seoul (KR); Myoung Won Suh, Yongin-Si (KR); Dae Hyeong Kim, Seoul (KR)

(73) Assignees: K.C. Tech Co., Ltd., Gyeonggi-Do (KR); IUCF-HYU, Seoul (KR)

( * ) Notice: Subject to any disclaimer, the term of this patent is extended or adjusted under 35 U.S.C. 154(b) by 417 days.

(21) Appl. No.: 11/421,965

(22) Filed: Jun. 2, 2006

(65) Prior Publication Data
US 2007/0075291 A1    Apr. 5, 2007

(30) Foreign Application Priority Data
Jun. 3, 2005    (KR) .................. 10-2005-0047646

(51) Int. Cl.
C09K 13/00    (2006.01)
(52) U.S. Cl. .................... 252/79.1; 252/79.4
(58) Field of Classification Search ............. 252/79.1, 252/79.4, 79.5
See application file for complete search history.

(56) References Cited

U.S. PATENT DOCUMENTS

| | | | | |
|---|---|---|---|---|
| 4,472,510 A * | 9/1984 | January | ............ | 501/12 |
| 4,664,679 A * | 5/1987 | Kohyama et al. | ............ | 51/308 |
| 5,593,467 A | 1/1997 | Monroe et al. | ............ | 51/309 |
| 5,645,618 A | 7/1997 | Monroe et al. | ............ | 51/309 |
| 5,651,801 A | 7/1997 | Monroe | ............ | 51/309 |
| 5,697,992 A | 12/1997 | Ueda et al. | ............ | 51/307 |
| 5,759,917 A | 6/1998 | Grover et al. | ............ | 438/690 |
| 5,772,780 A | 6/1998 | Homma et al. | ............ | 134/7 |
| 5,804,513 A | 9/1998 | Sakatani et al. | ............ | 438/693 |
| 5,958,794 A * | 9/1999 | Bruxvoort et al. | ............ | 438/692 |
| 5,994,260 A | 11/1999 | Bonneau et al. | ............ | 502/304 |
| 6,043,155 A | 3/2000 | Homma et al. | ............ | 438/691 |
| 6,221,118 B1 | 4/2001 | Yoshida et al. | ............ | 51/309 |
| 6,258,137 B1 | 7/2001 | Garg et al. | ............ | 51/298 |

(Continued)

FOREIGN PATENT DOCUMENTS

AU    4323197    4/1998

(Continued)

OTHER PUBLICATIONS

Derwent 2004-802513; KR 2004052355A; Jun. 23, 2004.*

(Continued)

*Primary Examiner* — Keith D Hendricks
*Assistant Examiner* — Patricia A George
(74) *Attorney, Agent, or Firm* — Steptoe & Johnson LLP

(57) ABSTRACT

A CMP slurry is provided comprising polishing particles, the polishing particle comprising organically modified colloidal silica. Also, a method of preparing a CMP slurry is provided, comprising the steps of: preparing polishing particles comprising organically modified silica; converting the polishing particles into an aqueous state; and adding pure water, a hydrophilic additive and a dispersing agent to the polishing particles. The polishing particles can be synthesized using a sol-gel process. According to the invention, a slurry having excellent polishing properties can be prepared, in which the surface properties of colloidal silica are changed to control the physical properties of the polishing particles and which can ensure a desired CMP removal rate while minimizing the occurrence of scratches.

20 Claims, 3 Drawing Sheets

U.S. PATENT DOCUMENTS

| | | | |
|---|---|---|---|
| 6,293,848 B1 * | 9/2001 | Fang et al. | 451/36 |
| 6,299,659 B1 | 10/2001 | Kido et al. | 51/309 |
| 6,343,976 B1 | 2/2002 | Yoshida et al. | 451/41 |
| 6,387,139 B1 | 5/2002 | Kido et al. | 51/309 |
| 6,410,444 B1 | 6/2002 | Kido et al. | 438/693 |
| 6,420,269 B2 | 7/2002 | Matsuzawa et al. | 438/693 |
| 6,436,835 B1 | 8/2002 | Kido et al. | 438/693 |
| 6,447,694 B1 | 9/2002 | Lee et al. | 252/79.1 |
| 6,478,836 B1 | 11/2002 | Kido et al. | 51/309 |
| 6,521,261 B2 * | 2/2003 | Sherwood et al. | 424/494 |
| 6,537,914 B1 | 3/2003 | Park et al. | 438/692 |
| 6,615,499 B1 | 9/2003 | Matsuzawa et al. | 51/309 |
| 6,623,355 B2 * | 9/2003 | McClain et al. | 451/60 |
| 6,740,591 B1 | 5/2004 | Miller et al. | 438/692 |
| 6,875,701 B2 | 4/2005 | Yanagisawa et al. | 438/714 |
| 6,964,923 B1 | 11/2005 | Ronay | 438/689 |
| 7,001,252 B2 | 2/2006 | Hasegawa et al. | 451/41 |
| 7,029,509 B2 | 4/2006 | Kim et al. | 51/308 |
| 7,364,600 B2 | 4/2008 | Kim et al. | 51/308 |
| 7,410,409 B1 | 8/2008 | Koyama et al. | 451/36 |
| 7,431,758 B2 | 10/2008 | Ota et al. | 106/3 |
| 7,470,295 B2 | 12/2008 | Kim et al. | 51/309 |
| 2001/0013507 A1 | 8/2001 | Hosali et al. | 216/89 |
| 2001/0034979 A1 | 11/2001 | Lee et al. | 51/309 |
| 2002/0016060 A1 | 2/2002 | Matsuzawa et al. | 438/633 |
| 2002/0069593 A1 | 6/2002 | Yoshida et al. | 51/309 |
| 2002/0151252 A1 | 10/2002 | Kawase et al. | 451/36 |
| 2003/0196386 A1 | 10/2003 | Hattori et al. | 51/307 |
| 2003/0216042 A1 | 11/2003 | Lee et al. | 438/689 |
| 2004/0020134 A1 | 2/2004 | Kim et al. | 51/307 |
| 2004/0234438 A1 | 11/2004 | Dai et al. | 423/263 |
| 2005/0194358 A1 | 9/2005 | Chelle | 216/88 |
| 2005/0198912 A1 | 9/2005 | Kim et al. | 51/307 |
| 2005/0252092 A1 | 11/2005 | Kim et al. | 51/307 |
| 2006/0013752 A1 | 1/2006 | Lee et al. | 423/263 |
| 2006/0032149 A1 | 2/2006 | Kim et al. | 51/307 |
| 2006/0156635 A1 | 7/2006 | Kim et al. | 51/309 |
| 2007/0075291 A1 | 4/2007 | Paik et al. | 252/79.1 |
| 2007/0158309 A1 | 7/2007 | Park | 216/89 |
| 2007/0240366 A1 | 10/2007 | Ota et al. | 51/298 |
| 2008/0132403 A1 | 6/2008 | Nho et al. | 501/152 |
| 2009/0100765 A1 | 4/2009 | Kim et al. | 51/307 |
| 2009/0133336 A1 | 5/2009 | Kim et al. | 51/298 |

FOREIGN PATENT DOCUMENTS

| | | |
|---|---|---|
| CA | 2238882 | 12/1996 |
| CN | 1061402 | 5/1992 |
| CN | 1235698 | 11/1999 |
| CN | 1355769 | 6/2002 |
| CN | 1394229 | 1/2003 |
| CN | 1480503 | 3/2004 |
| CN | 1610963 A | 4/2005 |
| EP | 0865412 | 9/1998 |
| EP | 0939431 | 1/1999 |
| EP | 1020501 | 7/2000 |
| EP | 1148538 | 10/2001 |
| EP | 1201607 | 2/2002 |
| FR | 2741869 | 6/1997 |
| JP | 05-105428 | 4/1993 |
| JP | 1995-081932 | 3/1995 |
| JP | 9-131660 | 5/1997 |
| JP | 10-106990 | 4/1998 |
| JP | 10-152673 | 9/1998 |
| JP | 11-501898 | 2/1999 |
| JP | 11-181403 | 7/1999 |
| JP | 2000-38573 | 2/2000 |
| JP | 2000-161519 | 6/2000 |
| JP | 2001-7195 | 1/2001 |
| JP | 2001-55559 | 2/2001 |
| JP | 2001-323254 | 11/2001 |
| JP | 2001-326199 | 11/2001 |
| JP | 2002-030271 | 1/2002 |
| JP | 2002-319556 | 10/2002 |
| JP | 2003-17446 | 1/2003 |
| JP | 2003-59868 | 2/2003 |
| JP | 2003-224092 | 8/2003 |
| JP | 2004-250714 | 9/2004 |
| JP | 2004-289170 | 10/2004 |
| JP | 2004-356326 | 12/2004 |
| KR | 1994-0000121 | 1/1994 |
| KR | 1998-032895 | 7/1998 |
| KR | 10-1998-0042755 | 8/1998 |
| KR | 1999-0085105 | 12/1999 |
| KR | 2000-0012088 | 2/2000 |
| KR | 2001-0004980 | 1/2001 |
| KR | 2001-0089878 | 10/2001 |
| KR | 2001-0108048 | 12/2001 |
| KR | 2002-029158 | 4/2002 |
| KR | 2003-043096 | 6/2003 |
| KR | 2003-0056238 | 7/2003 |
| KR | 10-2004-0012600 | 2/2004 |
| KR | 2002-0050161 | 2/2004 |
| KR | 2004-0019897 | 7/2004 |
| KR | 10-2004-0098671 | 11/2004 |
| KR | 10-2005-0006284 | 1/2005 |
| KR | 10-0480760 | 3/2005 |
| KR | 10-2005-0062637 | 6/2005 |
| KR | 10-0543781 | 1/2006 |
| NO | 982534 | 8/1998 |
| RU | 2178599 | 9/1997 |
| WO | WO 97/20772 | 6/1997 |
| WO | WO 98/14987 | 4/1998 |
| WO | WO 00/73211 A1 | 5/2000 |
| WO | WO 01/91975 A1 | 12/2001 |
| WO | WO 02/38338 A2 | 5/2002 |
| WO | WO 02/081584 A1 | 10/2002 |
| WO | WO 02/083804 A1 | 10/2002 |
| WO | WO 03/038883 A1 | 5/2003 |
| WO | WO 04/000659 A2 | 12/2003 |
| WO | WO 2004/037722 A1 | 6/2004 |
| WO | WO 2004/100243 A1 | 11/2004 |

OTHER PUBLICATIONS

Sang-Kyun Kim et al., "Influence of the electrokinetic behaviors of abrasive ceria particles and the deposited plasma-enhanced tetraethylorthosilicate and chemically vapor deposited Si3N4 films in an aqueous medium on chemical mechanical planarization for shallow trench isolation," J. Materi. Res., vol. 18, No. 9, Sep. 2003, pp. 2163-2169.

U.S. Appl. No. 60/142,706, filed Jul. 7, 1999, by Steven K. Grumbine et al., and entitled "CMP Composition Containing Surface Modified Abrasive Particles".

Ivanov E.N. et al., Effect of the heat treatment of cerium carbonate on the microstructure and polishing capacity of cerium dioxide, Tsvetn., Met 1989, vol. 5, pp. 80 to 83 (Russ.), Columbus, OH, USA.: Chemical Abstracts, vol. 111, No. 16, Oct. 16, 1989, p. 157, col. 2, the abstract No. 136865d.

Savin V.D. et al., Thermochemical studies of decomposition of cerium carbonate, Zh, Fix, Khim. 1985, vol. 59, No. 3, pp. 571 to 575 (Russ.), Columbus, OH, USA.: Chemical Abstracts, vol. 102, No. 22, Jun. 3, 1985, p. 798, col. 2, the abstract No. 196917w.

* cited by examiner

CMP SLURRY, PREPARATION METHOD THEREOF AND METHOD OF POLISHING SUBSTRATE USING THE SAME

CROSS-REFERENCE TO RELATED APPLICATION

This application claims priority under 35 U.S.C. §119 to Korean Patent Application No. 10-2005-0047646 filed on Jun. 3, 2005, and the entire contents of that application are expressly incorporated herein by reference thereto.

FIELD OF THE INVENTION

The present invention relates to a slurry for polishing, particularly chemical mechanical polishing (hereinafter, "CMP"), and more particularly to a method for preparing a CMP slurry which has a high rate of removal of a copper substrate in a copper wiring process needed to fabricate highly integrated semiconductors having 256 mega-D RAM or more with a design rule of, for example, 0.13 μm or less, and which decreases the occurrence of scratches, as well as a preparation method thereof and a method for polishing a substrate using the same

BACKGROUND OF THE INVENTION

CMP is a semiconductor processing technology in which mechanical processing, which is performed using polishing particles present between a pressed wafer and a polishing pad, and chemical etching, which is performed using a slurry, are simultaneously conducted, and has been an essential process in global planarization technology in the production of submicron-scaled semiconductor chips since IBM Corp., USA, developed it at the end of the 1980's.

A description will be given of a CMP process and the slurry needed for this process, with reference to FIGS. 1a to 1c. The CMP process, in which an uneven portion of the surface of a wafer is smoothed in a semiconductor process, is a process where, after the surface of the wafer is chemically transformed by an acidic or basic solution of the slurry to instantaneously form a layer weakly bonded to the surface, the layer thus formed is mechanically removed using particles in the slurry. In other words, the wafer is pressed while the slurry is provided on the surface of the wafer, thereby mechanically polishing the surface of the wafer using the particles in the slurry.

To conduct the CMP process, a head 3, on which a wafer 1 is to be mounted, a pad 4, rotating in the same direction as the head, and a slurry 2, provided therebetween and containing nano-sized polishing particles, are prepared. The wafer 1 is mounted on a wafer chuck 7 of the head 3 by surface tension or vacuum pressure. In the CMP process, the wafer 1 is polished by the pad 4 and the slurry 2. A polishing table 5, to which the pad 4 is attached, only rotates, but the head 3 simultaneously rotates and reciprocates while deviating from the center of rotation of the polishing table 5. At the same time, the wafer 1 is pressed toward the polishing table 5 with a predetermined pressure. The surface of the wafer 1 comes into contact with the pad 4 due to the weight of the head and the applied pressure, and the slurry flows into fine gaps in the interface, that is to say, the pores 8 of the pad. Mechanical polishing is achieved by polishing particles of the slurry and surface protrusions 9 of the pad 4, and chemical polishing is achieved by chemical components of the slurry. Furthermore, upper sides of projections of the wafer 1, in which devices are formed, first come into contact with the polishing particles or the surface protrusions, and pressure is concentrated on the projections of the wafer. Accordingly, the projections are removed at relatively high surface removal speed, resulting in uniform removal of the projections.

The types of slurry are roughly classified into a slurry for oxide, a slurry for metal, and a slurry for poly-silicon according to the type of object to be polished. The slurry for oxide is used in a CMP process which is applied for a metal wiring layer formed in an integrated circuit, and as the fabrication of integrated circuits using a copper wiring layer has recently been suggested, studies on a slurry for Cu CMP are ongoing. Several hundred active devices formed in an integrated circuit are interconnected to form a functional circuit and are connected in a multi-level manner. Metal interconnects, including a first metal layer, a second metal layer and a third metal layer, are electrically insulated by a dielectric material such as silicon dioxide. In particular, as copper has been used as each of the metal wiring layers in an integrated circuit, and a low-k material has been used as an insulating material, the rate of occurrence of scratches in a CMP process has greatly increased. Although copper has an electrical conductivity higher than that of aluminum wiring and is highly advantageous for high integration, it is softer than other metals, and thus can be easily scratched. Also, because the low-k material which is used as an insulating material is a soft material, it is easily broken and damaged. For this reason, in polishing of the copper wiring metal and the insulating film, polishing particles having a spherical shape and a narrow particle size distribution must be used.

The prior fumed silica and ceria particles have a wide particle size distribution and an irregular shape, and thus have a problem in that these particles can cause numerous scratches when used to polish films made of soft materials such as copper and low-k material. To improve this problem, nanosized colloidal silica particles have recently been frequently used. The colloidal silica particles have a particle size distribution that is narrower than that of other particles, and are uniformly spherical in shape, and thus entail a very low rate of occurrence of scratches when used to polish the surface of films. However, the colloidal silica particles still cause scratches on the surfaces of a copper film and an insulating film, and need be improved to reduce the occurrence of scratches.

In the prior art for preparing such Cu-CMP slurry, Japanese Patent Publication No. JP-2000-00161519 (JSR Co., Ltd.; Japan) and U.S. Patent Publication No. 60/142,706 (Cabot Corp., USA) disclose polishers and methods for preparing slurries having a low rate of occurrence of scratches using the same. In these patent publications, the properties of particles required for Cu-CMP slurry, the kind of additives, including polymers, and a method and process for preparing Cu-CMP slurries using these additives, are described over a very complex and broad range.

Most inventions utilize soluble metal silicates in the synthesis of colloidal silica or silica particles, however, if the synthesis is performed using such metal silicates, it will be difficult to control the shape and particle size of colloidal silica, and the addition of impurities will be caused in subsequent semiconductor processing, because the metal silicates contain salts such as Na.

Also, the prior art discloses the kind of slurry particles and the control of scratches according to the range of the slurry particles or additives, and these prior preparation methods have a problem in that they can cause numerous micro-scratches according to CMP process conditions. Also, the prior art does not mention the modification of the particle surface or the effect thereof on scratches.

SUMMARY OF THE INVENTION

Accordingly, the present invention has been made to solve the above-described problems occurring in the prior art, keeping in mind the above problems occurring in the prior art, and an object of the present invention is to provide an organically modified colloidal silica (ORMOSIL) slurry essential to COMP in a process for the fabrication of an ultra-highly semiconductor having a design rule of less than 0.13 μm, particularly a copper wiring process, the colloidal silica slurry being developed by properly employing a method and device for pre-treating various particles, synthesis equipment and a method of operation thereof, a method of adding chemical additives and an amount added, on the basis of a comprehensive and concrete understanding of the properties clearly required for a polishing slurry, including slurry particle properties according to preparation and process conditions, organic modification, the correlation between particle size distribution, particle shape, and polishing, and the change in particle surface area, as well as a method for preparing the organically modified silica slurry.

Particularly, an object of the present invention is to provide a slurry having optimal polishing particle properties, in which the surface properties of colloidal silica are changed to control the physical properties of polishing particles and which can be effectively used to fabricate a semiconductor having a fine design rule, thereby providing a CMP slurry which can ensure a desired CMP removal rate while suppressing the occurrence of scratches, as well as a preparation method thereof.

Another object of the present invention is to provide a method for effectively polishing a semiconductor substrate of a fine design rule using the above-described slurry.

To achieve the above objects, the present invention relates to a CMP slurry comprising polishing particles, the polishing particles comprising organically modified colloidal silica.

The polishing particles may comprise polishing particles having a median particle size of 20-150 nm. The polishing particles may comprises primary particles having a median particle size of 10-120 nm, and the primary particles may comprise grains having a median particle size of 10-100 nm.

The polishing particles may be organically modified with organometallic alkoxide. The organometallic alkoxide may be any one selected from among methyl trimethoxysilane (MTMS), phenyl trimethoxysilane (PTMS) and vinyl trimethoxysilane (VTMS). The degree of organic modification of the polishing particles is preferably 0.02-70%.

The slurry may additionally comprise a hydrophilic additive. The hydrophilic additive may be any one selected from among alkyl ethoxylate, linear alkylbenzene sulfonate (LAS), alkyldimethyl amine oxide, and alkyl carboxy betaine. The hydrophilic additive is preferably contained in an amount of 0.0001-10 wt % and comprises a polymer having a molecular weight of 2,000-50,000 g/mol.

The slurry may additionally comprise pure water and a polymeric dispersing agent. The polymeric dispersing agent may be any one selected from among polyethylene glycol, polyampholyte and potassium nonanoic acid. The polymeric dispersing agent is preferably contained in an amount of 0.0001-10 wt % and comprises a polymer having a molecular weight of 2,000-50,000 g/mol.

The slurry may additionally comprise a weak acid or a weak base. Also, the slurry may additionally comprise an additive for polishing a copper film. The additive for polishing a copper film may comprise one or a mixture of two or more selected from among nitride, hydrogen peroxide, nitric acid, ammonium nitrate, iron nitrate, copper nitrate, organic acid and benzotriazole.

In another aspect, the present invention provides a method for preparing a CMP slurry, comprising the steps of: preparing polishing particles comprising organically modified silica; converting the polishing particles into an aqueous state; and adding pure water, a hydrophilic additive and a dispersing agent to the polishing particles. The polishing particles can be synthesized using a sol-gel process.

The step of preparing the polishing particles may comprise adding an organic solvent and an acid to organo-metallic alkoxide to synthesize organically modified colloidal silica particles. Also, the step of preparing the polishing particles may comprise the sub-steps of: adding an acid to an aqueous solution of soluble metal silicate or metal alkoxide to synthesize pure colloidal silica particles; and adding organometallic alkoxide to the pure colloidal silica particles and stirring the mixture.

The step of converting the polishing particles into the aqueous state can be performed using a cross-filtering process.

The inventive method may additionally comprise, after the step of adding the pure water, the hydrophilic additive and the dispersing agent to the polishing particles, a step of adding an additive for polishing a copper film to the mixture.

In still another aspect, the present invention provides a method for polishing a substrate, comprising polishing a given substrate using the above-described CMP slurry. The given substrate may have copper, tantalum nitride and tantalum films formed thereon.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, a method for preparing a CMP slurry according to the present invention and the analysis of the properties of a slurry prepared thereby will be described in detail. Also, the following description of a specific embodiment of the present invention will be made with respect to the use of organically modified colloidal silica as one example of polishers and the use of DI water, a hydrophilic additive and a polymeric dispersing agent as additives thereto and a dispersing agent thereof, and with respect to CMP results, including the removal rates and surface properties of a copper film and a tantalum film according to a method and process conditions for preparing the organically modified colloidal silica. The present invention, which will be described below, can be modified in various manners, and the scope of the present invention will not be limited to the following description.

Figure 1A:
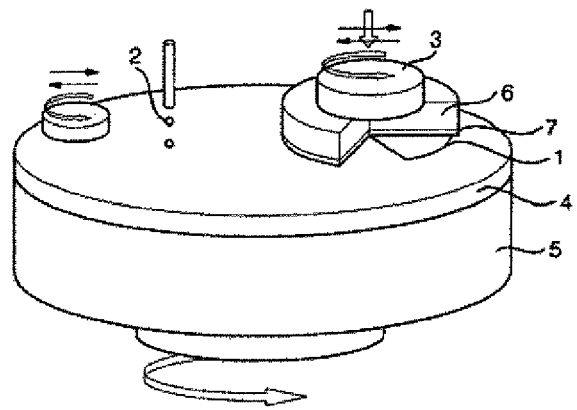
FIGS. 1a and 1b are a schematic perspective view and a cross-sectional view of a CMP apparatus.
Figure 1B:
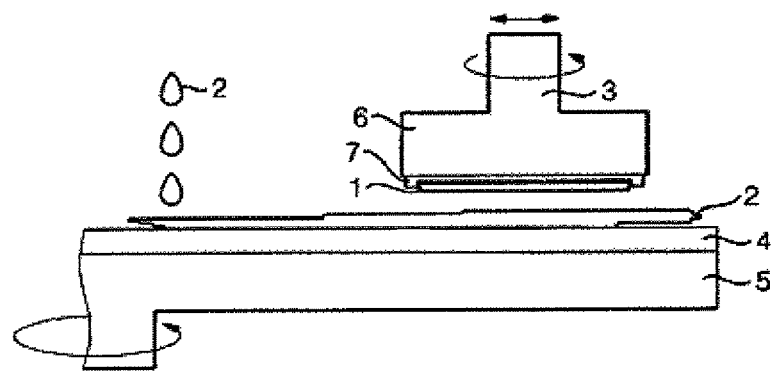
Figure 1C:
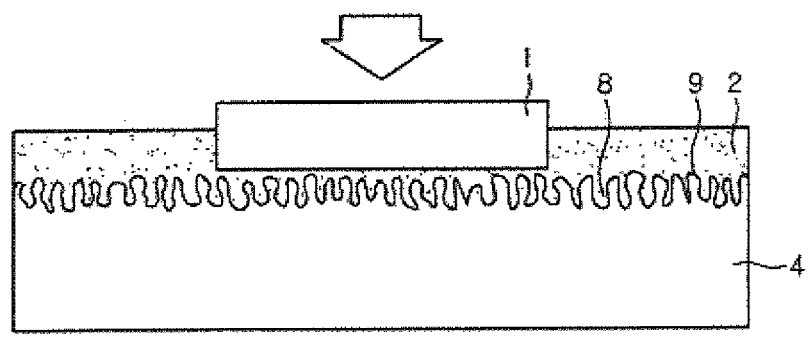
FIG. 1c is a schematic cross-sectional view showing a CMP process.
Figure 2:
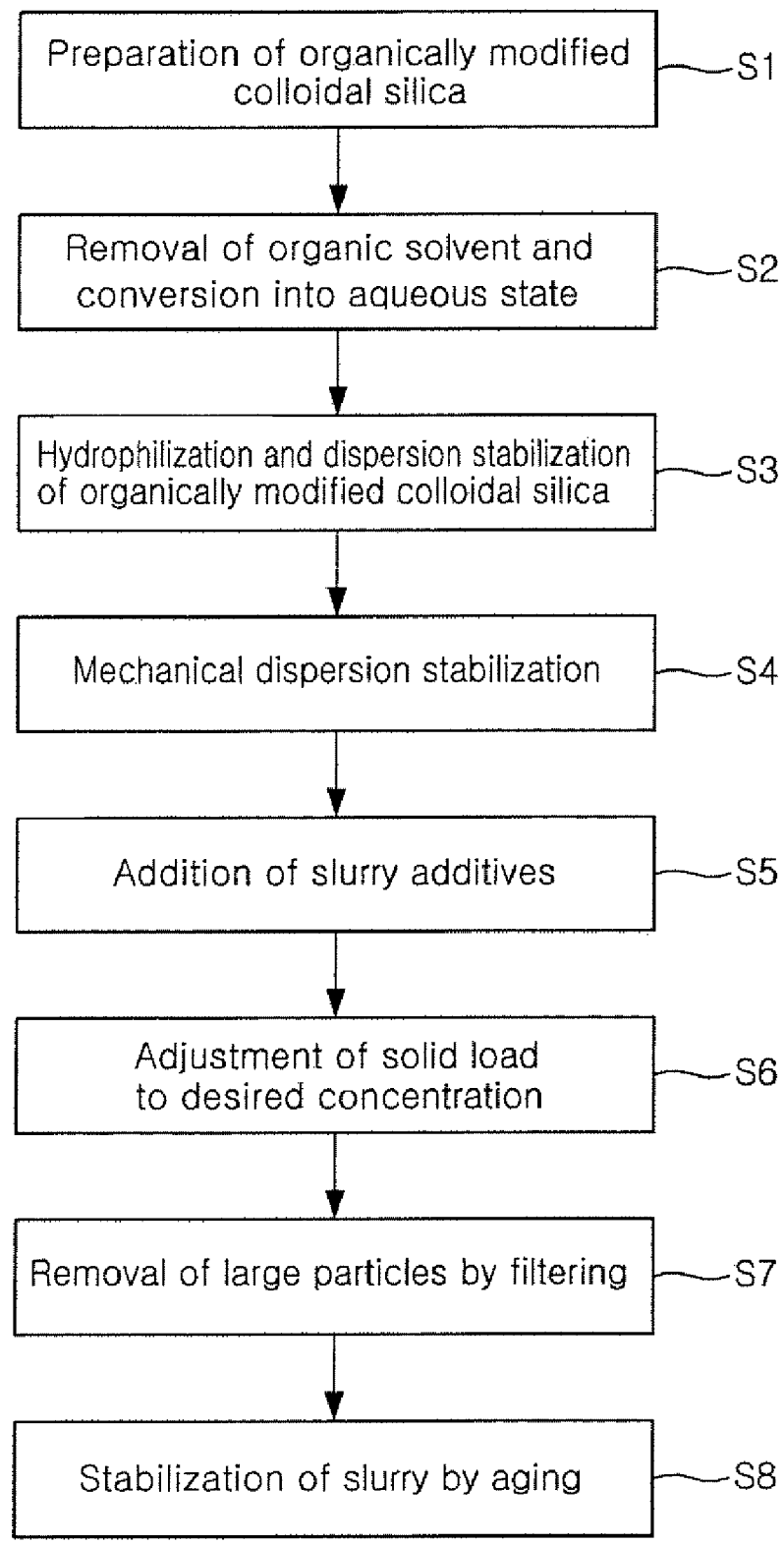
FIG. 2 is a block diagram showing a process for preparing a slurry according to the present invention.

In one embodiment of the present invention, the organically modified colloidal silica slurry is prepared to include colloidal silica powder, DI water and additives such as a hydrophilic additive, a polymeric dispersing agent and a weak acid or base. A brief description of this colloidal silica slurry for polishing will now be made with reference to FIG. 2.

Organo-metallic alkoxide is used to prepare organically modified colloidal silica (S1), and an organic solvent is removed to convert the silica into an aqueous state (S2). The organically modified colloidal silica is hydrophilized, and the dispersion thereof is stabilized by adding a dispersing agent (S3). Then, the colloidal silica is mechanically dispersed and stabilized by means of a high-energy dispersion machine (S4). To the slurry thus prepared, additives such as an oxidizing agent, a corrosion inhibitor and a chelating agent, which are used for the polishing of a copper film, are added to improve the ability of the slurry to polish the copper film (S5). To the slurry, pH-buffering agents such as a weak acid, a weak base, an organic acid, or a buffering agent are added, and then mixed in a high speed mixer to stabilize the slurry. The weight ratio (wt %) of the slurry, i.e., the solid load, is adjusted to within the desired range, and large particles are removed through filtering to prevent the occurrence of scratches during precipitation and polishing (S7). Additional aging is conducted, thereby stabilizing the slurry (S8).

This method of preparing the colloidal silica slurry will now be described in detail.

Method for Preparing Colloidal Silica Slurry

1. Preparation of Colloidal Silica

The preparation of the colloidal silica slurry according to the present invention starts with a step of synthesizing colloidal silica sol through a sol-gel process to prepare colloidal silica having a spherical shape and a narrow particle size distribution.

Examples of a precursor used to synthesize the particles using the sol-gel process include soluble metal silicate, metal alkoxide, and organo-metal alkoxide, and the synthesized silica may be mono-dispersed colloidal silica, silica gel, fumed silica or precipitated silica. Generally, silica can be prepared by mixing an aqueous solution of soluble metal silicate, or metal alkoxide with acids consisting of an inorganic acid, an inorganic acid, or carbon dioxide, and then subjecting the mixture to hydrolysis and condensation. In other words, to the homogenized solution, an aqueous or nonaqueous solvent such as water or alcohol is added to induce the hydrolysis of the precursor, to which a base is then added to induce the condensation of the precursors, thus producing silica particles The condensation reaction is generally conducted for at least 20 hours, in which the properties of the particles are realized through the control of temperature. Also, the properties of the particles can be controlled according to a co-solvent process using at least two organic solvents, the concentration of the precursor, and the amount of the base.

In the preparation of such silica particles, the present invention intends to prepare organically modified colloidal silica. To this end, in the synthesis of the silica particles, organically modified silica particles can be prepared using organo-metallic alkoxide as a precursor, or the surface of synthesized pure colloidal silica particles can be coated with organo-metallic alkoxide. Because the colloidal silica thus prepared is organically modified at the surface, the friction between it and a copper film during a CMP process can be minimized. Also, because it has a hardness lower than that of pure colloidal silica, it can minimize scratching and dishing phenomena.

In synthesizing the organically modified silica particles using organo-metallic alkoxide as a precursor, examples of the organo-metallic alkoxide precursor, which can be used in the present invention, may include methyl trimethoxysilane (MTMS), phenyl trimethoxysilane (PTMS), or vinyl trimethoxysilane (VTMS).

This precursor is added and homogenized in an alcoholic organic solvent. In this regard, the organic solvent can be used in the acidic pH range to promote the homogenization and hydrolysis of the added precursor. In other words, the solvent is used in a mixture with, for example, nitric acid or hydrochloric acid so as to promote the homogenization and hydrolysis of the precursor. Due to the hydrolysis, silicic acid is formed, which is a molecular unit reactant in a sol-gel reaction, in which the silicic acid as a monomer is polymerized. Then, when basic ammonia or other basic substances are added, the silicic acid unit formed as a result of the hydrolysis is condensed by reaction with other units and is grown into a polymer via a dimer and an oligomer. As this reaction progresses, it will grow into three-dimensional particles.

In the synthesis of the colloidal silica using organo-metallic alkoxide, the organically modified colloidal silica is formed through hydrolysis and condensation, and the synthesis reaction thereof is as follows.

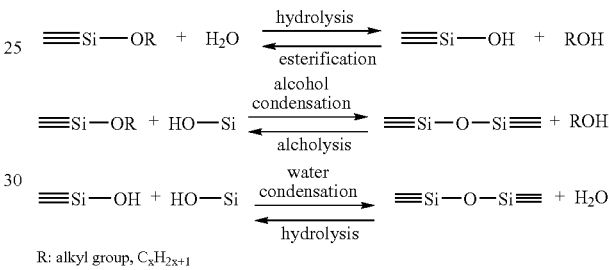

R: alkyl group, $C_xH_{2x+1}$

Because alkoxysilane is not miscible with water, alcohol is added for the homogenization of the alkoxysilane. Even after hydrolysis occurs, esterification with ROH occurs and ROH and $H_2O$ produced by condensation are involved in the reaction. In this case, the properties of the finally synthesized particles may vary depending on the kind of alkyl group, and also organically modified silicate particles having various properties can be synthesized by controlling the amount of precursor, hydroxide, organic solvent, and acid or base added.

Meanwhile, organically modified silica particles can be prepared by coating pure colloidal silica particles with organo-metallic alkoxide. In other words, pure colloidal silica is synthesized by adding an alcohol, such as methanol or ethanol, and a base to an aqueous solution of tetraethylorthosilicate (TEOS) and subjecting the mixture to a sol-gel process. When organo-metallic alkoxide such as methyl methoxysilane (MTMS), phenyl methoxysilane (PTMS) or vinyl trimethoxysilane (VTMS) is added to the synthesized pure colloidal silica and stirred, the surface of the silica particles can be coated with organic component-containing silica, whereby the surface of the silica particles can be organically modified.

As described above, because the organically modified colloidal silica according to the present invention is organically modified at the surface, friction, particularly between it and a soft copper film in a CMP process, can be minimized, and thus the polishing properties thereof can be improved. Also, because it has a hardness lower than that of pure colloidal silica, it can minimize scratching and dishing phenomena.

The polishing particles of the organically modified colloidal silica particles preferably comprise polishing particles having a median particle size of 20-150 nm. Also, the polishing particles comprise primary particles having a median particle size of 10-120 nm, the primary particles preferably comprising grains having a median particle size of 10-100 nm. If a Cu CMP process is conducted using particles having a size larger than the above-specified size range, these particles can cause many scratches on the surface of a soft Cu film, and particularly cause the delamination of a low-k film used as an insulating film, thus causing damage to a device. If particles having a size smaller than the above range are used, it will be difficult to expect polishing properties due to the excessively small polishing particles.

2. Cross Filtration

The colloidal silica synthesized according to the above-described method is in a state in which it is dispersed in the organic solvent. Thus, in order to allow the silica to be used as a CMP slurry, the silica must be converted into aqueous colloidal silica by removing the organic solvent. Solvent removal methods used herein include: evaporation exchange, in which the organic solvent is evaporated and replaced with water; spray drying, comprising collecting particles by high-pressure spraying after high-temperature heating, and then dispersing the collected particles in water; and a filtration method, wherein the organic solvent is passed through an organic membrane having a pore size of a few nanometers, and the silica particles are collected.

The present invention utilizes a cross-filtering method, an application of the filtration method, in which the organic solvent is continuously extracted and removed and, at the same time, water is added, such that extraction and washing are performed at the same time. According to the cross-filtering method, the silica is converted into an aqueous state and, at the same time, by-products on the particle surface can be removed by washing, thus improving the properties of the slurry. In other words, the removal of the organic solvent, the conversion of the silica particles into an aqueous state, and the washing of the particle surface, are simultaneously conducted in order to increase efficiency and control agglomeration and by-products on the particle surface, which are problems occurring upon conversion of the silica particles into the aqueous state.

3. Dispersion Stabilization

The above-prepared colloidal silica has low dispersion stability, because the surface of the organically modified silica particles is hydrophobic. Thus, for the dispersion of the silica particles in the slurry, a hydrophilic additive serving to modify the surface of the silica particles is added. The hydrophilic additive can be selected from the group consisting of alkyl ethoxylate, linear alkylbenzene sulfonate (LAS), alkyldimethyl amine oxide, and alkyl carboxy betaine. The hydrophilic additive is preferably added in an amount of 0.0001-10 wt %, and preferably comprises a polymer having a molecular weight of 2,000-50,000 g/mol.

Also, for the dispersion stabilization of the inventive slurry, a dispersing agent is added. Examples of the polymeric dispersing agent used herein may include polyethlyene glycol, polyampholyte, potassium nonanoic acid and the like. The dispersing agent is preferably added in an amount of 0.0001-10 wt % and preferably comprises a polymer having a molecular weight of 2,000-50,000 g/mol. This is because, if the molecular weight of the dispersing agent is more than 50,000 g/mol, it can cause re-agglomeration between particles due to a phenomenon such as bridging, thus promoting the production of large particles.

In addition, the inventive slurry comprises a weak acid, organic acid, or weak base for pH adjustment and slurry stabilization. This acid or base must also achieve stabilization of various additives to be subsequently added.

4. Mechanical Dispersion and Stabilization

For the formation and dispersion of coarse particles in the colloidal silica slurry, mechanical dispersion is performed using a high-energy dispersion machine Through such mechanical dispersion, agglomerated particles present in the slurry can be removed, and nanosized silica particles, having a high specific surface area, can be stabilized. In the slurry thus treated, the agglomeration of particles does not occur even with the passage of time, and the particles are reduced in size and stabilized due to high shear dispersion. Herein, the inside of a stirrer and a tank in the dispersion machine can be coated or lined with Teflon in order to protect the metal from contamination.

Ultrapure water or pure water is added such that the concentration of polishing particles (colloidal silica particles), i.e., the solid load, is in a range of 5-40 wt %, and preferably 10-30 wt %. The higher the solid load, the higher the production efficiency; however, if the solid load is maintained at an excessively high level, the viscosity of the slurry will be excessively increased and the agglomeration of the particles will be increased, making it impossible to conduct a mechanical process. For this reason, the solid load needs to be maintained at a suitable range.

5. Addition of Additives for Polishing of Copper Film

Generally, a slurry which is used for the CMP of copper interconnects is supplied as two types of solutions. The first solution is used in conditions for improving the removal rate of copper and for increasing selectivity to tantalum nitride and oxide films. The first solution contains acidic nitrate or hydrogen peroxide ($H_2O_2$) as an oxidizing agent for promoting the oxidation of a copper film, and an organic acid such as acetic acid, citric acid or tartaric acid as a corrosive agent for inducing the corrosion of a copper film to promote polishing. Also, benzotriazole is used as a corrosion inhibitor for preventing the corrosion of the pinholes and cracks of a copper film to perform surface polishing. The aforementioned additives are added and mixed with the slurry, and a weak acid or weak base is added to the slurry to adjust the pH thereof, thus stabilizing the slurry, and a pH buffering agent is added to stabilize the pH of the slurry.

Also, the second solution is used as a polishing agent for making the selectivity to copper equal to tantalum, tantalum nitride and oxide films so as to prevent copper dishing and erosion, which are defects occurring in the CMP of copper interconnects. The second solution contains nitride, nitric acid, ammonium nitrate, iron nitrate, copper nitrate, or a mixture thereof, as an agent for improving the removal rate of tantalum compounds. Also, it contains a mixture of a corrosion inhibitor and an organic acid in order to make the removal rate of a copper film equal to the removal rate of tantalum compounds. The slurry containing the additives is stirred in a high-speed mixer to make the additives in the slurry uniform and stable.

The CMP results for the copper film-polishing slurry containing the above-described additives will be described in detail later.

6. Control of Solid Load (Wt %) and Removal of Large Particles

As described above, after completion of the dispersion stabilization process of the slurry, the solid load (wt %) of the colloidal silica slurry is controlled within the desired range, and large particles of the slurry, which can cause CMP scratches, precipitation, and agglomeration, are removed by filtration. As the amount of large particles increases, the gravitational force is larger than the dispersion force caused by the repulsive force between the particles, and surface areas of the large particles are smaller than those of the fine particles, and thus the dispersibility of the large particles is less than that of the fine particles. For those two reasons, agglomeration and precipitation frequently occur, making the slurry unstable. Therefore, it is necessary to remove the large particles. Furthermore, the removal of the large particles increases as the number of repetitions of filtration for removing the large particles increases.

5. Aging of Slurry

Stabilization of the slurry by aging is achieved by stirring the slurry in a tank for 24 hours so as to still further stabilize the slurry. This may be additionally conducted using the completed slurry, and may be omitted if not necessary.

Analysis of Properties of Colloidal Silica Slurry

Hereinafter, the preparation of colloidal silica and slurry in various conditions according to the above-described preparation method, and the polishing properties of the prepared slurry, will be described. Measurement systems for various analyses are as follows.

1) Particle size distribution: measured with APS (Matec Applied Science, USA);
2) Degree of organic modification: measured with HR-TEM (Jeol, Japan) using phase area ratio;
3) Interfacial potential behavior (dispersion stability): measured with ESA 9800 (Matec Applied Science, USA);
4) Viscosity: measured with Brookfield viscometer DVII+;
5) pH: measured with a pH meter (Orion, USA).

Slurries 1 to 5: Synthesis of Organo-Metallic Alkoxide Precursor

Slurries 1 to 5 are prepared according to the method described above, in which organo-metallic alkoxide is used as a precursor in the synthesis of silica particles to prepare organically modified colloidal silica. The slurries 1 to 5 are prepared according to the same process, except that they have different degrees of organic modification depending on the concentration of an organic solvent, the kind of alcohol added, and the concentration of the precursor. These slurries are synthesized such that the primary particles among the polishing particles have a particle size of 40 nm. The properties of the slurries are shown in Table 1 below.

TABLE 1

| | Organic modification (% per particle) | Viscosity (cps) | Zeta potential | Particle size (nm) |
|---|---|---|---|---|
| Slurry 1 | 10 | 3 | −40 | 39 |
| Slurry 2 | 20 | 3 | −40 | 40 |
| Slurry 3 | 30 | 3 | −40 | 40 |
| Slurry 4 | 50 | 3 | −40 | 40 |
| Slurry 5 | 65 | 3 | −40 | 40 |

The organic modification, which is the degree of organic modification per polishing particle, is preferably in the range of 0.02-70%. If the organic modification of the polishing particle is less than 0.02%, the surface of the particle will not be organically modified, and so cannot achieve the effect of a reduction in friction force in CMP polishing and can cause many scratches. Also, as the organic modification of the polishing particle increases, the friction of the polishing particle with a copper film in CMP polishing is decreased and the hardness of the polishing particle is also decreased, so that scratches can be effectively reduced. However, if the organic modification is more than 70%, the removal rate will be remarkably reduced and the particle having such organic modification will be difficult to use as a polishing particle. For this reason, the organic modification of the polishing particles must be controlled in consideration of the removal rate and scratches.

Slurries 6-10: Coating with Organo-Metallic Alkoxide

Slurries 6-10 are prepared according to the above-described method, in which, in the synthesis of colloidal silica particles, pure colloidal silica particles are synthesized, and then the surface thereof is coated with organo-metallic alkoxide. In other words, pure colloidal silica is synthesized by adding methanol (MeOH), ethanol (EtOH) or ammonia water ($NH_4OH$) to tetraethylorthosilicate (TEOS) and subjecting the mixture to a sol-gel process, and then organo-metallic alkoxide is added to the synthesized colloidal silica in an amount of 10-30 vol % based on the volume of the tetraethylorthosilicate (TEOS), followed by stirring for 3-40 hours. The slurries 6-10 are prepared according to the same process, except that they have different degrees of organic modification depending on the concentration of the organic solvent, the kind of alcohol added and the concentration of the precursor. The properties of the slurries 6-10 are shown in Table 2 below.

TABLE 2

| | Organic modification (% per particle) | Viscosity (cps) | Zeta potential (mV) | Particle size (nm) |
|---|---|---|---|---|
| Slurry 6 | 5 | 3 | −35 | 40 |
| Slurry 7 | 10 | 3 | −35 | 42 |
| Slurry 8 | 15 | 3 | −34 | 45 |
| Slurry 9 | 20 | 3 | −35 | 48 |
| Slurry 10 | 25 | 3 | −34 | 48 |

CMP Test Results

The colloidal slurries prepared as described above were prepared as primary and secondary slurries for use in the CMP of copper interconnects, and the polishing properties thereof were tested for a copper film and a tantalum film. As a CMP polishing apparatus, 6DS-SP (Strasbaugh, USA) was used, and the test was conducted for a 8-inch wafer having a 7000□ thick copper (Cu) film applied on the entire surface thereof, and a 8-inch wafer having a tantalum nitride film (TaN) about 750□-thick applied on the entire surface thereof, and test conditions and materials used are as follows.

1) Pad: IC1400 (commercially available from Rodel, USA);
2) Film thickness meter: 4 point probe (commercially available from PSIA, Korea);
3) Table speed: 70 rpm;
4) Spindle Speed: 70 rpm;
5) Down force: 4 psi;
6) Back pressure: 0 psi;
7) Slurry supply: 200 ml/min.;
8) Remaining particles and scratches: measured with Surfscan SP1 (KLA-Tencor, USA).

The slurries 1-10 prepared as described above are used to prepare primary slurries 1-10 for the CMP of copper interconnects. The primary slurries serve to increase the removal rate of copper and to increase selectivity to tantalum nitride and oxide films, and they contain oxygen nitride or hydrogen peroxide for promoting the oxidation of copper films, or contain an organic acid such as acetic acid, citric acid or tartaric acid that corrodes copper films. The primary slurries 1-10 are prepared by adding the additives to the slurries 1-10 and then stabilizing the pH of the slurries.

The primary slurries 1-10 were used to polish the entire surface of the wafers for 1 minute, and then, from the change in the thickness of the wafers as a result of the polishing, the removal rate was determined. Micro-scratches were measured using Surfscan SP1. Each of the slurries was used three times to polish the above-prepared blank wafers, and then measured for polishing properties, and the averaged measurement results are shown in Table 3 below.

TABLE 3

| | Preparation condition | Organic modification (% per particle) | Cu removal rate (Å/min) | Ta removal rate (Å/min) | TaN removal rate (Å/min) | Cu:Ta (or TaN) selectivity |
|---|---|---|---|---|---|---|
| Primary slurry 1 | Synthesis of precursor | 10 | 8700 | 85 | 84 | 102:1 |
| Primary slurry 2 | Synthesis of precursor | 20 | 8500 | 85 | 83 | 100:1 |
| Primary slurry 3 | Synthesis of precursor | 30 | 8300 | 83 | 83 | 100:1 |
| Primary slurry 4 | Synthesis of precursor | 50 | 7980 | 76 | 75 | 105:1 |
| Primary slurry 5 | Synthesis of precursor | 65 | 7800 | 73 | 71 | 106:1 |
| Comparative Example 1 | Synthesis of precursor | — | 8900 | 87 | 85 | 104:1 |
| Primary slurry 6 | Coating with particles | 10 | 7600 | 70 | 68 | 108:1 |
| Primary slurry 7 | Coating with particles | 20 | 7550 | 71 | 70 | 106:1 |
| Primary slurry 8 | Coating with particles | 30 | 7010 | 67 | 67 | 104:1 |
| Primary slurry 9 | Coating with particles | 50 | 6780 | 62 | 63 | 109:1 |
| Primary slurry 10 | Coating with particles | 65 | 6520 | 59 | 30 | 110:1 |
| Comparative Example 2 | Coating with particles | — | 8850 | 85 | 83 | 104:1 |

It can be seen that all the primary slurries 1-10 had usable ranges of Cu, Ta and TaN removal rates and were excellent in selectivity, which indicates the removal rate ratio of Cu:Ta (or TaN). Also, as can be seen in Table 3, the primary slurries prepared using the organically modified colloidal silica had a relatively low Cu removal rate compared to Comparative Examples 1 and 2, prepared using pure colloidal silica which had not been organically modified, and as the organic modification of the silica polishing particles was increased, the Cu removal rate thereof was decreased. This is because the surface of the organically modified colloidal silica was organically modified, and thus, as the organic modification thereof was increased, the friction thereof with the copper film was decreased. Also, because the organically modified colloidal silica had low hardness, scratching and dishing phenomena caused thereby could be reduced.

Generally, removal rate increases with an increase in the solid load of polishing particles in a slurry. The present invention is performed such that the solid load of the polishing particles is adjusted to the range of 5-40 wt %, and preferably 10-30 wt %, using ultrapure water or pure water.

Meanwhile, using the slurries 1-10 prepared as described above, the secondary slurries 1-10 for the CMP of copper interconnects are prepared. The secondary slurries serve to make the selectivity to copper equal to tantalum, tantalum nitride and oxide films, thus preventing dishing and erosion phenomena as defects occurring in the CMP of copper interconnects, and they contain, as an agent for improving the removal rate of tantalum compounds, nitride, nitric acid, ammonium nitrate, iron nitrate or copper nitrate, or a mixture of a corrosion inhibitor and an organic acid. The secondary slurries 1-10 are prepared by adding the additives to slurries 1-10 and then making the additives in the slurries uniform and stable.

The above-prepared secondary slurries 1-10 were used to polish the entire surface of wafers for 1 minute, and then, from the change in the thickness of the wafers caused by the polishing, the removal rate was measured. Micro-scratches were measured using Surfscan SP1. Each of the slurries was used three times to polish the above-prepared blank wafers, and then measured for polishing properties, and the averaged results of the measurement results are shown in Table 4 below.

TABLE 4

| | Preparation condition | Organic modification (% per particle) | Removal rate (Å/min) | | | | Scratches |
|---|---|---|---|---|---|---|---|
| | | | Cu | Ta | TaN | Oxide | |
| Secondary slurry 1 | Synthesis of precursor | 10 | 350 | 345 | 340 | 330 | No |
| Secondary slurry 2 | Synthesis of precursor | 20 | 330 | 342 | 340 | 330 | No |
| Secondary slurry 3 | Synthesis of precursor | 30 | 310 | 305 | 310 | 300 | No |
| Secondary slurry 4 | Synthesis of precursor | 50 | 260 | 265 | 257 | 250 | No |
| Secondary slurry 5 | Synthesis of precursor | 65 | 240 | 242 | 240 | 250 | No |
| Comparative Example 3 | Synthesis of precursor | — | 380 | 340 | 350 | 320 | Numerous |
| Secondary slurry 6 | Coating with particles | 10 | 368 | 362 | 357 | 347 | No |

TABLE 4-continued

| | Preparation condition | Organic modification (% per particle) | Removal rate (Å/min) | | | | Scratches |
|---|---|---|---|---|---|---|---|
| | | | Cu | Ta | TaN | Oxide | |
| Secondary slurry 7 | Coating with particles | 20 | 347 | 359 | 355 | 346 | No |
| Secondary slurry 8 | Coating with particles | 30 | 323 | 320 | 326 | 315 | No |
| Secondary slurry 9 | Coating with particles | 50 | 273 | 278 | 270 | 262 | No |
| Secondary slurry 10 | Coating with particles | 65 | 252 | 254 | 252 | 260 | No |
| Comparative Example 4 | Coating with particles | — | 380 | 340 | 350 | 320 | Numerous |

It can be seen that all the secondary slurries 1-10 had usable ranges of the removal rates of copper, tantalum, tantalum nitride and oxide films, and the selectivity ratio of the removal rates of copper:tantalum:oxide was 1:1:1. Also, because the organically modified colloidal silica had low hardness, the scratching and dishing phenomena caused thereby could be reduced. In other words, as can be seen in Table 4 above, the secondary slurries comprising the organically modified colloidal silica did not generate scratches compared to Comparative Examples 3 and 4, prepared using pure colloidal silica. Also, it can be seen that, as the organic modification of the silica polishing particles was increased, the removal rate of the copper film was decreased. This is because the surface of the organically modified colloidal silica was organically modified, and thus, as the organic modification thereof was increased, the friction thereof with the copper film was decreased.

Figure 3:
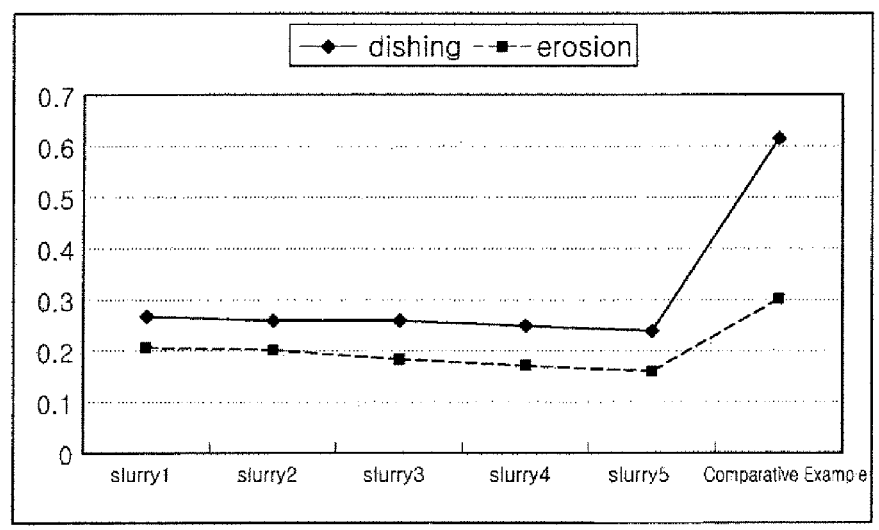
FIGS. 3 and 4 are graphic diagrams showing dishing and erosion results obtained after performing Cu CMP using the inventive slurry.
Figure 4:
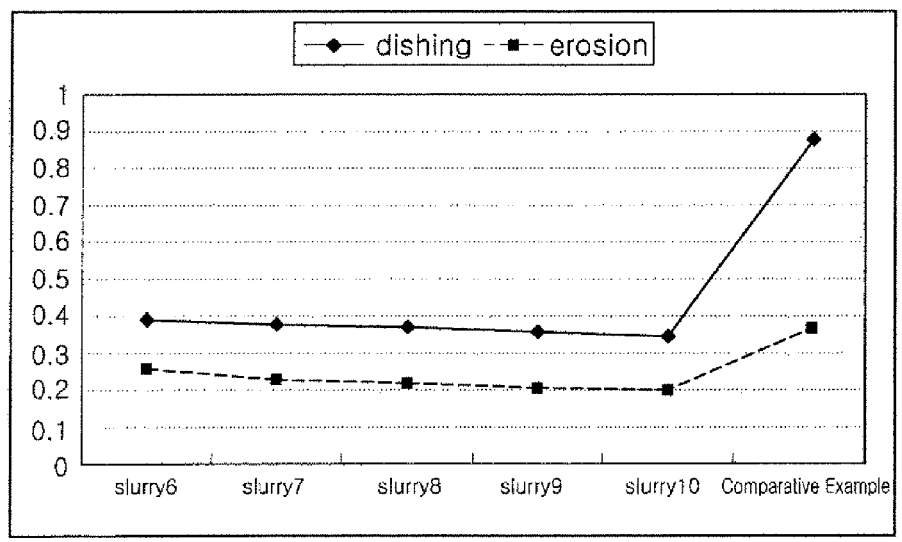

Furthermore, patterned wafers (for SKW_Cu CMP Test) were used to evaluate dishing and erosion. The CMP processing conditions were the same as in the flat wafers, and the results are shown in FIGS. 3 and 4. As can be seen in the figures, the Cu CMP slurries prepared using the organically modified colloidal silica according to the present invention showed remarkably reduced dishing and erosion phenomena compared to the slurries prepared using pure colloidal silica which had not been organically modified.

Therefore, according to the present invention, slurry having excellent polishing properties can be prepared, in which the surface properties of colloidal silica are changed to control the physical properties of the polishing particles and which ensures a desired CMP removal rate while minimizing scratches.

A method for polishing a substrate using the above described polishing slurry will now be described.

The substrate polishing method according to the present invention comprises polishing a given substrate using the polishing slurry as described above. Specifically, a slurry containing, as polishing particles, organically modified colloidal silica particles, which have a narrow particle size distribution, a spherical shape, and controlled physical properties, is prepared.

Preferably, a substrate having a copper film and tantalum film formed thereon is prepared, and the substrate is polished with a slurry which can ensure a desired CMP removal rate and minimize the occurrence of scratches as a result of changing the surface properties of colloidal silica and controlling the physical properties of the polishing particles.

As described above, according to the present invention, a polishing slurry having improved properties can be prepared using the organically modified colloidal silica. Particularly, it is possible to effectively reduce scratching or dishing phenomena which are problems occurring in the prior slurry for the CMP of copper interconnects in a semiconductor fabrication process.

Therefore, according to the present invention, it is possible to prepare a slurry having excellent properties with respect to various properties essential for a Cu CMP slurry This slurry can be applied for various patterns required in ultra-highly integrated semiconductor processing and can achieve excellent results with respect to removal rate, polishing selectivity, polishing uniformity, and within-wafer-nonuniformity (WI-WNU).

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A CMP slurry comprising polishing particles, the polishing particles comprising organically-modified colloidal silica;
   wherein the organically-modified colloidal silica is synthesized using organo-metallic alkoxide as a precursor by sol-gel reaction; and
   wherein the polishing particles have an organic modification of 5-65%.

2. The CMP slurry of claim 1, wherein the polishing particles comprise primary particles having a median particle size of 10-120 nm, the primary particles comprising grains having a median particle size of 10-100 nm.

3. The CMP slurry of claim 1, wherein the polishing particles comprise polishing particles having a median particle size of 20-150 nm.

4. The CMP slurry of claim 3, wherein the polishing particles comprise primary particles having a median particle size of 10-120 nm, the primary particles comprising grains having a median particle size of 10-100 nm.

5. The CMP slurry of claim 1, wherein the organo-metallic alkoxide is selected from the group consisting of methyl trimethoxysilane (MTMS), phenyl trimethoxysilane (PTMS) and vinyl trimethoxysilane (VTMS).

6. The CMP slurry of claim 1, further comprising a hydrophilic additive.

7. The CMP slurry of claim 6, wherein the hydrophilic additive is contained in an amount of 0.0001-10 wt %.

8. The CMP slurry of claim 6, wherein the hydrophilic additive comprises a polymer having a molecular weight of 2,000-50,000 g/mol.

9. The CMP slurry of claim 6, wherein the hydrophilic additive is selected from the group consisting of alkyl ethoxylate, linear alkylbenzene sulfonate (LAS), alkyldimethyl amine oxide, and alkyl carboxy betaine.

10. The CMP slurry of claim 9, wherein the hydrophilic additive is contained in an amount of 0.0001-10 wt %.

11. The CMP slurry of claim 9, wherein the hydrophilic additive comprises a polymer having a molecular weight of 2,000-50,000 g/mol.

12. The CMP slurry of claim 1, wherein the slurry additionally comprises pure water and a polymeric dispersing agent.

13. The CMP slurry of claim 12, wherein the polymeric dispersing agent is contained in an amount of 0.0001-10 wt %.

14. The CMP slurry of claim 12, wherein the polymeric dispersing agent comprises a polymer having a molecular weight of 2,000-50,000 g/mol.

15. The CMP slurry of claim 12, wherein the polymeric dispersing agent is selected from the group consisting of polyethylene glycol, polyampholyte and potassium nonanoic acid.

16. The CMP slurry of claim 15, wherein the polymeric dispersing agent is contained in an amount of 0.0001-10 wt %.

17. The CMP slurry of claim 15, wherein the polymeric dispersing agent comprises a polymer having a molecular weight of 2,000-50,000 g/mol.

18. The CMP slurry of claim 1, wherein the slurry additionally comprises a component selected from the group consisting of weak acid, organic acid, and weak base.

19. The CMP slurry of claim 1, wherein the slurry additionally comprises an additive for polishing a copper film.

20. The CMP slurry of claim 19, wherein the additive for polishing a copper film comprises a component selected from the group consisting of nitride, hydrogen peroxide, nitric acid, ammonium nitrate, iron nitrate, copper nitrate, organic acid, benzotriazole, and mixtures thereof.

* * * * *